(12) United States Patent
Nishio et al.

(10) Patent No.: US 8,012,837 B2
(45) Date of Patent: Sep. 6, 2011

(54) METHOD OF MANUFACTURING SEMICONDUCTOR DEVICE

(75) Inventors: Johji Nishio, Tokyo (JP); Chiharu Ota, Kanagawa (JP); Takuma Suzuki, Kanagawa (JP); Hiroshi Kono, Kanagawa (JP); Makoto Mizukami, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/716,403

(22) Filed: Mar. 3, 2010

(65) Prior Publication Data

US 2011/0059597 A1     Mar. 10, 2011

(30) Foreign Application Priority Data

Sep. 9, 2009    (JP) ................................ 2009-207940

(51) Int. Cl.
*H01L 21/336*     (2006.01)
*H01L 21/425*     (2006.01)
*H01L 21/265*     (2006.01)

(52) U.S. Cl. ........ 438/285; 438/518; 438/514; 438/522; 257/E21.09

(58) Field of Classification Search .................. 438/197, 438/285, 518, 514, 522; 257/E21.09
See application file for complete search history.

(56) References Cited

U.S. PATENT DOCUMENTS

2005/0001217 A1*   1/2005   Kusumoto et al. .............. 257/77
2006/0108325 A1*   5/2006   Everson et al. .................. 216/88

OTHER PUBLICATIONS

Y. Nakano, et al., "Investigation of Pits Formed at Oxidation on 4H-SiC", Materials Science Forum vols. 600-603, 2009, pp. 377-380.

* cited by examiner

*Primary Examiner* — Alexander G Ghyka
*Assistant Examiner* — Seahvosh J Nikmanesh
(74) *Attorney, Agent, or Firm* — Oblon, Spivak, McClelland, Maier & Neustadt, L.L.P.

(57) ABSTRACT

A method of manufacturing a semiconductor device capable of realizing a high yield of a large-scale semiconductor device even when a silicon carbide semiconductor including a defect is used is provided. The method of manufacturing a semiconductor device includes: a step of epitaxially growing a silicon carbide semiconductor layer on a silicon carbide semiconductor substrate; a step of polishing a surface of the silicon carbide semiconductor layer; a step of ion-implanting impurities into the silicon carbide semiconductor layer after the step of polishing; a step of performing heat treatment to activate the impurities; a step of forming a first thermal oxide film on the surface of the silicon carbide semiconductor layer after the step of performing heat treatment; a step of chemically removing the first thermal oxide film; and a step of forming an electrode layer on the silicon carbide semiconductor film.

8 Claims, 15 Drawing Sheets

METHOD OF MANUFACTURING SEMICONDUCTOR DEVICE

CROSS-REFERENCE TO RELATED APPLICATION

This application is based upon and claims the benefit of priority from Japanese Patent Applications No. 2009-207940, filed on Sep. 9, 2009, the entire contents of which are incorporated herein by reference.

FIELD OF THE INVENTION

The present invention relates to a method of manufacturing a semiconductor device using a silicon carbide semiconductor substrate.

BACKGROUND OF THE INVENTION

In a power semiconductor device, a chip area is increased as a usual practice to increase a current capacity. However, since a crystal defect density in a substrate cannot be sufficiently decreased yet in a silicon carbide semiconductor device, when increasing a chip area, a considerable decrease in yield occurs. For this reason, devices with large current capacity are difficult to be manufactured at a high yield.

Relationships between a crystal defect and electric characteristics of a semiconductor device have been examined for a long time. However, particularly in a compound semiconductor such as a silicon carbide (SiC) semiconductor device, various types of defects such as a point defect, a complex defect, dislocation, extended dislocation, and a stacking fault occur. The so-called electric characteristics include various defective modes. At present, distinct one by one relationships between a crystal defect and electric characteristics cannot be easily obtained.

It is reported that a pit formed during formation of a thick oxide film on a silicon carbide semiconductor device deteriorates the reliability of an insulating film of a MOSFET (Y. Nakano, T. Nakamura, A. Kamisawa and H. Takasu, "Investigation of Pits Formed at Oxidation on 4H—SiC", Material Science Forums Vols. 600-603 (2009) pp. 377 to 380).

SUMMARY OF THE INVENTION

A method of manufacturing a semiconductor device according to an embodiment of the present invention, includes: a step of epitaxially growing a silicon carbide semiconductor layer on a silicon carbide semiconductor substrate; a step of polishing a surface of the silicon carbide semiconductor layer; a step of ion-implanting impurities into the silicon carbide semiconductor layer after the step of polishing; a step of performing heat treatment to activate the impurities; a step of forming a first thermal oxide film on the surface of the silicon carbide semiconductor layer after the step of performing heat treatment; a step of chemically removing the first thermal oxide film; and a step of forming an electrode layer on the silicon carbide semiconductor film.

A method of manufacturing a semiconductor device according to an embodiment of the present invention, includes: a step of epitaxially growing a silicon carbide semiconductor layer of a first conductivity type on a silicon carbide semiconductor substrate; a step of determining a defect position to be a leakage current source of the silicon carbide semiconductor layer; a step of ion-implanting impurities in the defect position to form impurity layer of a second conductivity type; and a step of forming an electrode pad on the silicon carbide semiconductor layer.

A method of manufacturing a silicon carbide semiconductor device according to an embodiment of the present invention, includes: a step of epitaxially growing a silicon carbide semiconductor layer on a silicon carbide semiconductor substrate; a step of determining a defect position to be a leakage current source of the silicon carbide semiconductor layer; a step of selectively forming an insulating film on the defect position; and a step of forming an electrode pad on the silicon carbide semiconductor layer and the insulating film.

DETAILED DESCRIPTION OF THE EMBODIMENTS

The inventors of the present invention found that, in a diode formed on a silicon carbide epitaxial substrate, a reverse-bias leakage current increases if pits present in a surface of an epitaxial layer below an electrode pad. It was found that most pits causing increase of reverse-bias leakage current have depths of several micrometers or less from a surface.

The inventors also found that, in a silicon carbide substrate, various defects occur in a cooling step after an activation heat treatment performed following impurity ion implantation. Occurrence of defects is prominent in a large-diameter wafer having a diameter of about 4 inches. The reason seems to be as follows. Even though a cooling step is performed at a cooling rate equal to that in use of a small-diameter wafer, a temperature difference between a wafer center and a wafer periphery increases due to the large wafer diameter. A thermal stress generated by the large temperature difference exceeds a critical shearing stress.

Through an observation in further detail, it was observed that a large number of dislocation loops occur on an epitaxial wafer surface or that Shockley type extended dislocation is generated to reach an SiC/oxide film interface. The dislocation loops or the Shockley extended dislocation seems to occur with the pits previously present on the epitaxial layer surface as nucleation centers. It has been found that not only the pits, but also defects such as the dislocation loops and the Shockley type extended dislocation influence the reliability of an oxide film of a MOSFET.

Embodiments of the present invention to be explained with reference to the drawings are based on the above-mentioned knowledge found by the inventors.

First Embodiment

A method of manufacturing a semiconductor device according to the embodiment includes: a step of epitaxially growing a silicon carbide semiconductor layer on a silicon carbide semiconductor substrate; a step of polishing a surface of the silicon carbide semiconductor layer; a step of implanting impurity ions into the silicon carbide semiconductor layer after the step of polishing; a step of performing heat treatment to activate the impurities; a step of forming a first thermal oxide film on the surface of the silicon carbide semiconductor layer after the step of performing thermal treatment; a step of chemically removing the first thermal oxide film; and a step of forming an electrode layer on the silicon carbide semiconductor layer.

As a semiconductor device, a junction barrier Schottky diode (to be also simply referred to as a Schottky diode hereinafter) will be exemplified. According to the embodiment, pits on an epitaxial layer surface are removed, and thus a reverse-bias leakage current of a Schottky diode is suppressed. Consequently, Schottky diodes can be manufactured at a high yield.

Figure 1:
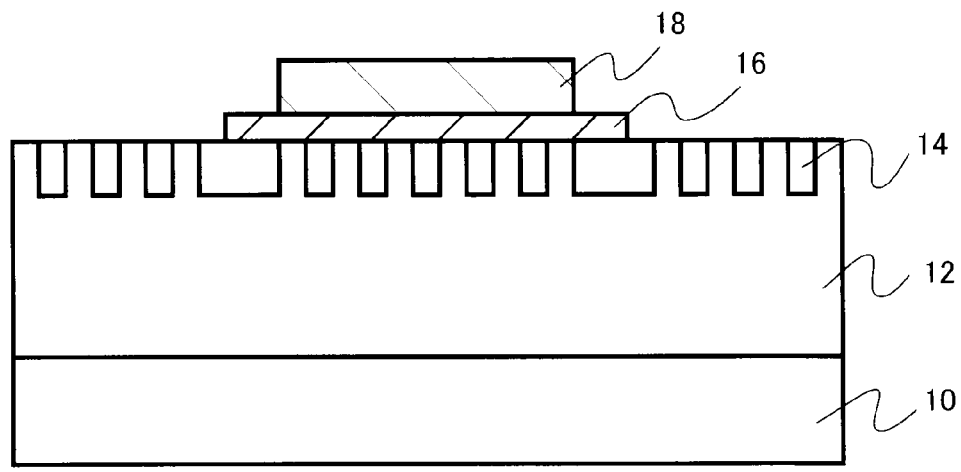
FIG. 1 is a sectional view of a semiconductor device according to a first embodiment.

FIG. 1 is a sectional view of a semiconductor device manufactured by the manufacturing method according to the embodiment. On an $n^+$-type substrate 10 of 4H—SiC(0001) Si surface containing nitrogen as impurities, an n-type epitaxial layer 12 having a nitrogen concentration lower than that of an $n^+$-type substrate 10 is formed. On a surface of the n-type epitaxial layer 12, a plurality of p-type ion implantation regions 14 are formed. The p-type ion implantation regions 14 deplete Schottky junction surfaces when applying a reverse bias, thereby suppressing a reverse-bias leakage current.

On the n-type epitaxial layer 12, a Schottky electrode material 16 made of, for example, titanium is formed. On the Schottky electrode material 16, for example, the pad electrode 18 made of aluminum is formed.

Figure 2A:
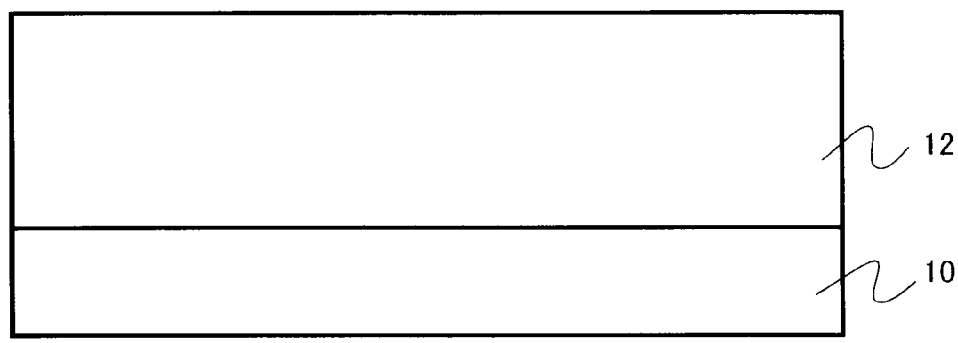
FIGS. 2A to 2F are process sectional views showing a method of manufacturing a semiconductor device according to the first embodiment.

FIGS. 2A to 2D are process sectional views showing the method of manufacturing the semiconductor device shown in FIG. 1. As shown in FIG. 2A, for example, the $n^+$-type substrate 10 of 4H—SiC (0001) Si surface is prepared. On the $n^+$-type substrate 10, the n-type epitaxial layer 12 having a nitrogen concentration lower than that of the $n^+$-type substrate 10 is formed by epitaxial growth.

A growth film thickness of the n-type epitaxial layer 12 is, for example, about 10 μm to 15 μm. A growth film thickness in the epitaxial growth is desirably set to a film thickness obtained by adding a thickness expected to reduce by polishing in the later step of polishing to a designed film thickness determined based on a endurance voltage (VRRM: Maximum Repetitive Peak Reverse Voltage) design of the Schottky diode.

The surface of the n-type epitaxial layer 12 is polished by, for example, chemical mechanical polishing (CMP). This polishing is performed to remove pits formed on the surface of the n-type epitaxial layer 12.

As a polishing method, chemical mechanical polishing is preferable because a strained layer generated after the polishing is small and the degree of flatness after the polishing is high. However, instead of the chemical mechanical polishing, another method such as mechanical polishing or the like can also be employed. When an amount of polishing is large, it is also effective to use a method having a high surface removing rate such as mechanical polishing and chemical mechanical polishing in combination.

This step of polishing is desirably performed immediately after epitaxial growth so as to avoid generation of a new defect having strain as a nucleation center in a step of performing heat treatment and the like.

An amount of polishing in the step of polishing is desirably 2 μm or more in terms of removal of strain. The amount of polishing is more preferably 4 μm or more, and is furthermore preferably 4.5 μm or more.

The upper limit of the amount of polishing is not set to a specific value in terms of removal of strain. However, in terms of productivity, an amount of polishing is desirably 10 μm or less.

It is desirable to provide a step of inspecting the shape of a silicon carbide semiconductor layer surface after the step of polishing. This shape inspection can be performed by using a known defect counter or the like. Pits on a wafer are counted through the shape inspection. When the step of inspecting is provided, it can be determined whether additional polishing is required, or a defective wafer should be extracted.

Figure 2B:

As shown in FIG. 2B, a thermal oxide film 20 is formed on the surface of the n-type epitaxial layer 12 after the pits are removed, for example. The thermal oxide film 20 is formed through heat treatment at 1050° C. for 2 hours in an atmosphere containing water vapor (wet oxidation), for example. The thermal oxide film 20 is a so-called sacrifice oxide film.

By forming the thermal oxide film 20, a process-strained layer after polishing is removed. However, after the formation of the thermal oxide film 20, undulation of the wafer surface is larger than that before the formation of the thermal oxide film 20. The large undulation may have an influence on semiconductor device characteristics.

It is effective to perform the heat treatment in a water vapor atmosphere to reduce undulation generated after the formation of the thermal oxide film 20. Therefore, the thermal oxide film 20 is desirably formed in the water vapor atmosphere.

Since pits on the surface are removed in the above step of polishing, generation of a defect having a pit as a nucleation center is suppressed in the formation of the thermal oxidation film.

Figure 2C:
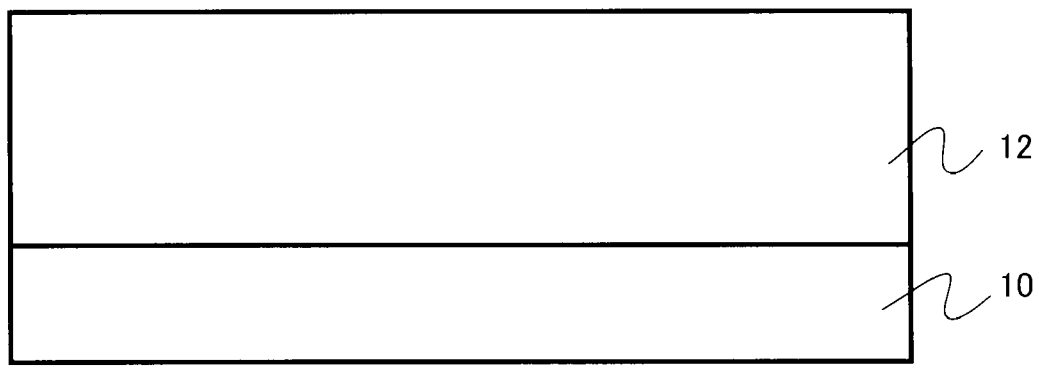

The thermal oxide film 20 is chemically removed as shown in FIG. 2C. For example, the thermal oxide film 20 is removed by dissolving with an ammonium fluoride aqueous solution.

Figure 2D:
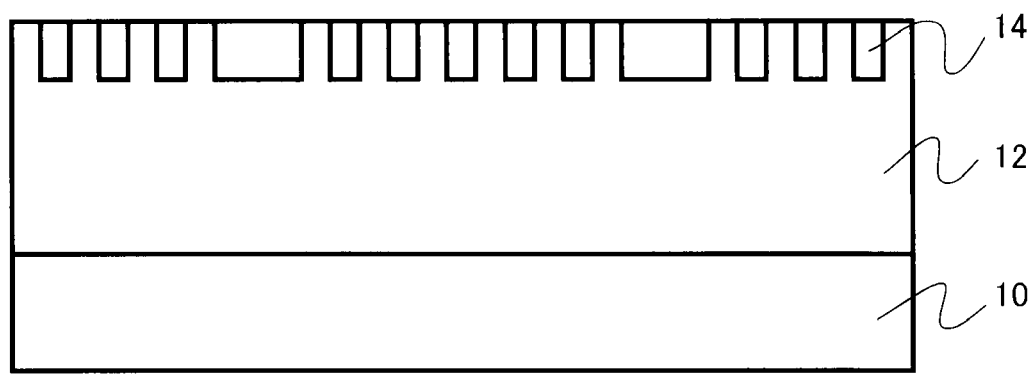

As shown in FIG. 2D, on the surface of the n-type epitaxial layer 12, the p-type ion implantation regions 14 are formed. The p-type ion implantation regions 14 contain, for example, aluminum as impurities. The p-type ion implantation regions 14 are formed through, for example, multi-step ion implantation of aluminum.

After the surface of the n-type epitaxial layer 12 is covered with a graphite cap (not shown), heat treatment to activate the impurities introduced by the ion implantation is performed. This heat treatment is performed at 1650° C. for 10 minutes in an argon atmosphere, for example. Thereafter, the graphite cap is removed in a stream of oxygen.

Since pits in the surface are removed in the previous step of polishing, a defect having a pit as a nucleation center is suppressed from occurring in the heat treatment.

Figure 2E:
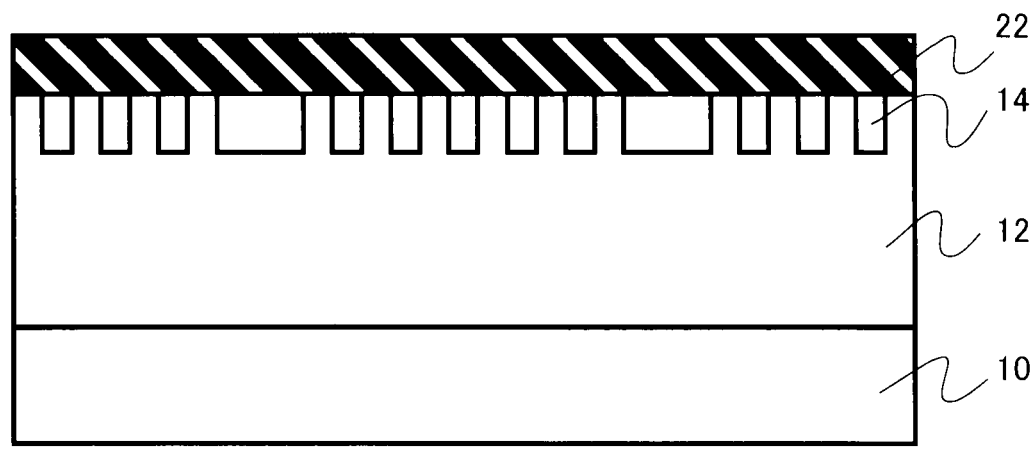

As shown in FIG. 2E, a thermal oxide film 22 is formed on the surface of the n-type epitaxial layer 12. The thermal oxide film 22 is formed at 1150° C. in an atmosphere containing water vapor to have a thickness of about 40 nm, for example. The thermal oxide film 22 is a so-called sacrifice oxide film.

By forming the thermal oxide film 22, a damage layer formed by ion implantation is removed. However, as described above, after the formation of the thermal oxide film 22, undulation of the wafer surface is larger than that before the formation of the thermal oxide film 22. The large undulation may have an influence on semiconductor device characteristics.

It is effective to perform the heat treatment in a water vapor atmosphere also to reduce undulation generated after the formation of the thermal oxide film 22. Therefore, the thermal oxide film 22 is desirably formed in the water vapor atmosphere.

Since pits on the surface are removed in the above step of polishing, a defect having a pit as a nucleation center in the formation of the thermal oxidation film is suppressed from occurring.

Figure 2F:
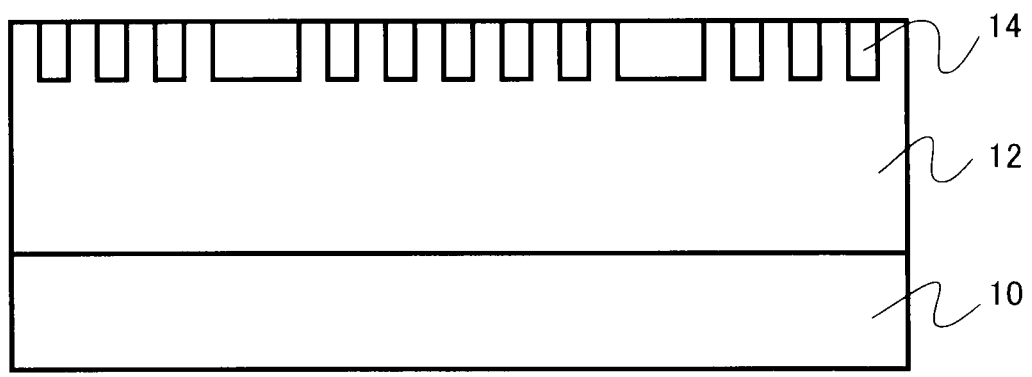

The thermal oxide film 22 is chemically removed as shown in FIG. 2F. For example, the thermal oxide film 22 is removed by dissolving with an ammonium fluoride aqueous solution.

Thereafter, the Schottky electrode material 16 is formed on the surface of the n-type epitaxial layer 12. Furthermore, the pad electrode 18 is formed on the Schottky electrode material 16.

For example, a titanium film is formed on the surface of the n-type epitaxial layer 12 by a sputtering method. An aluminum film is formed on the titanium film by a sputtering method.

Thereafter, coated with a photoresist, prebaked, and exposed using a photomask. After development, postbaking is performed. By using such patterned photoresist as a mask material, the aluminum film on portions without photoresist is etched by a chlorine-based dry etching apparatus. Fluorine-based dry etching is subsequently performed to leave titanium on only the Schottky electrode surface.

Thereafter, the photoresist is removed. In this manner, the junction barrier Schottky diode shown in FIG. 1 is manufactured.

According to the embodiment, pits on the epitaxial layer surface are removed, and thus a reverse-bias leakage current of the Schottky diode is suppressed. Consequently, the Schottky diodes can be manufactured at a high yield.

An example of the present invention will be explained. A 3-inch wafer of $n^+$-type substrate of 4H—SiC(0001) Si surface was prepared. On the $n^+$-type substrate an n-type epitaxial layer having a nitrogen concentration lower than that of the $n^+$-type substrate was grown by epitaxial growth. Then, the surface of the n-type epitaxial layer is polished by chemical mechanical polishing (CMP) while changing amounts of nitrogen.

For respective amounts of polishing, the numbers of defects were measured by using an optical automatic wafer inspection system available from CANDELA INSTRUMENTS as a defect counter. The chemical mechanical polishing was temporarily stopped under the time control to change the amounts of polishing (thicknesses of removed surfaces) as described above. Each time the polishing was stopped, the number of detected defects was inspected. In this example, causes of the detected defects were not especially discriminated, and thus the defects also include various surface morphologies, pits, and the like due to crystal defects. The result is shown in Table 1.

TABLE 1

| Thickness of Removed Surface (μm) | The number of Detected Defects (pieces) |
|---|---|
| 0.0 | 73 |
| 1.0 | 51 |
| 2.0 | 36 |
| 3.0 | 26 |
| 3.5 | 23 |
| 4.0 | 20 |
| 4.5 | 18 |

When polishing was not performed, 73 defects were detected. However, when the epitaxial layer was polished 2 μm, the number of defects halves. It was understood that a decreasing rate is started to be saturated when the epitaxial layer was polished 4 μm and the number of defects satisfies a level of 20 or less which was an experiential criteria for realizing preferable device characteristics.

Based on the result, a junction barrier Schottky diode was manufactured according to the manufacturing method explained in the first embodiment. An amount of polishing of chemical mechanical polishing was 4.5 μm, and sacrifice oxidation was performed by dry oxidation. For comparison, a comparative example in which chemical mechanical polishing was not performed was prepared.

In each of the example and the comparative example, reverse-bias leakage current was evaluated to calculate a yield. As a criteria for determining the yield, a diode in which a voltage obtained when a reverse-bias leakage current exceeds 50 A/cm$^2$ is 1900 V or more was determined to be accepted as a product with endurance voltage (VRRM) of 1700V, and a ratio of acceptable products was defined as the yield. As a result of measuring reverse-bias current-voltage characteristics, yields in the example were considerably improved to 86 to 89%, although with wafer to wafer variations, comparing to yields of 8 to 22% in the comparative example.

Second Embodiment

Figure 3:
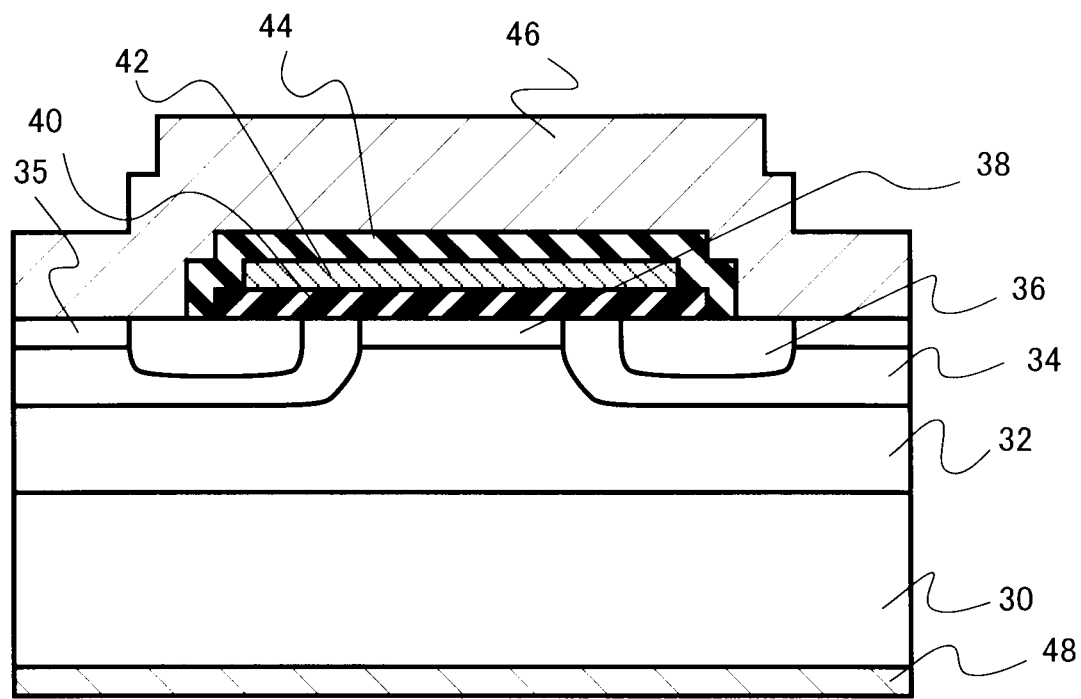
FIG. 3 is a sectional view of a semiconductor device according to a second embodiment.

A method of manufacturing a semiconductor device according to the embodiment is a method of manufacturing a vertical power MOSFET. FIG. 3 is a sectional view of a semiconductor device manufactured by the manufacturing method according to the embodiment.

On a main surface of an $n^+$-type substrate 30 of 4H—SiC (0001) Si surface, an n-type epitaxial layer 32 having a nitrogen concentration lower than that of the $n^+$-type substrate 30 is formed.

In a surface part of the n-type epitaxial layer 32, for example, p-type base regions 34 having an impurity concentration of $1\times10^{17}$/cm$^3$ are formed. In surface parts of the p-type base regions 34, $n^+$-type source regions 36 shallower than the p-type base regions 34 are formed. In the surface part of the n-type epitaxial layer 32 sandwiched by the p-type base regions 34, an $n^-$-type surface channel layer 38 is formed. In the surface part of the p-type base region 34, a p-type contact region 35 is formed.

On the surface of the n-type epitaxial layer 32 including the $n^-$-type surface channel layer 38, a gate oxide film 40 made of, for example, a thermal oxide film is formed. A gate electrode 42 is formed on the gate oxide film 40. The gate electrode 42 is covered with an SiO$_2$ insulating interlayer 44.

A source electrode 46 to which the $n^+$-type source regions 36 and the p-type base regions 34 (p-type contact regions 35) are electrically connected is provided on the SiO$_2$ insulating interlayer 44. On a back surface of the $n^+$-type substrate 30, a drain electrode 48 is provided.

Figure 4A:
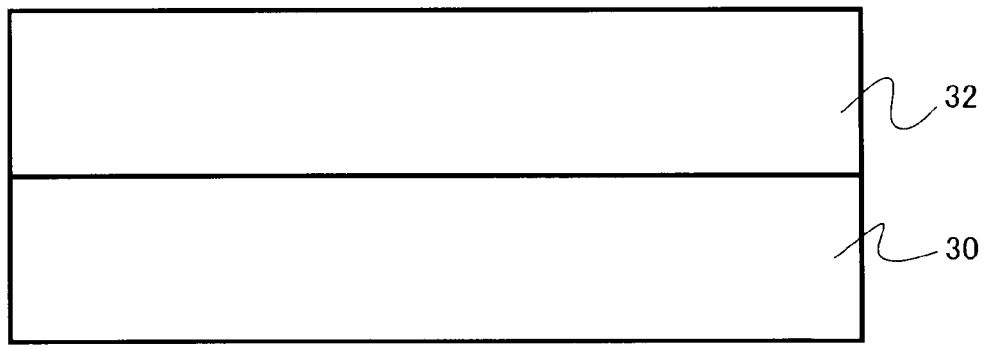
FIGS. 4A to 4G are process sectional views showing a method of manufacturing a semiconductor device according to the second embodiment.

FIGS. 4A to 4G are process sectional views showing the method of manufacturing the semiconductor device shown in FIG. 3. As shown in FIG. 4A, for example, the n$^+$-type substrate 30 of 4H—SiC (0001) Si surface is prepared. On the n$^+$-type substrate 30, the n-type epitaxial layer 32 having a nitrogen concentration lower than that of the n$^+$-type substrate 30, for example, is formed by epitaxial growth.

A growth film thickness of the n-type epitaxial layer 32 is about 10 μm to 15 μm. A growth film thickness in epitaxial growth is desirably set to a film thickness obtained by adding a thickness expected to be reduced by polishing in the latter step of polishing to a designed film thickness determined based on the characteristics of a vertical power MOSFET.

A surface of the n-type epitaxial layer 32 is polished by, for example, chemical mechanical polishing (CMP). This polishing is performed to remove pits formed on the surface of the n-type epitaxial layer 32.

As a polishing method, chemical mechanical polishing is preferably used because a process-strained layer generated after the polishing is small and the degree of flatness after the polishing is high. However, instead of the chemical mechanical polishing, another method such as mechanical polishing or the like can also be employed. When an amount of polishing is large, it is also effective to use a method having a high surface removing rate such as mechanical polishing and chemical mechanical polishing in combination.

This step of polishing is desirably performed immediately after epitaxial growth so as to avoid generation of a new defect due to a step of performing heat treatment and the like.

An amount of polishing in the step of polishing is desirably 3 μm or more in terms of removal of strain. The amount of polishing is more preferably 4 μm or more, and is furthermore preferably 4.5 μm or more.

The upper limit of the amount of polishing is not set to a specific value in terms of removal of strain. However, in terms of productivity, an amount of polishing is desirably 10 μm or less.

It is desirable to provide a step of inspecting the shape of a silicon carbide semiconductor layer surface after the step of polishing. This shape inspection can be performed by using a known defect counter or the like. Pits on a wafer are counted through the shape inspection. When the step of inspecting is provided, it can be determined whether additional polishing is required, or a defective wafer should be extracted.

Figure 4B:
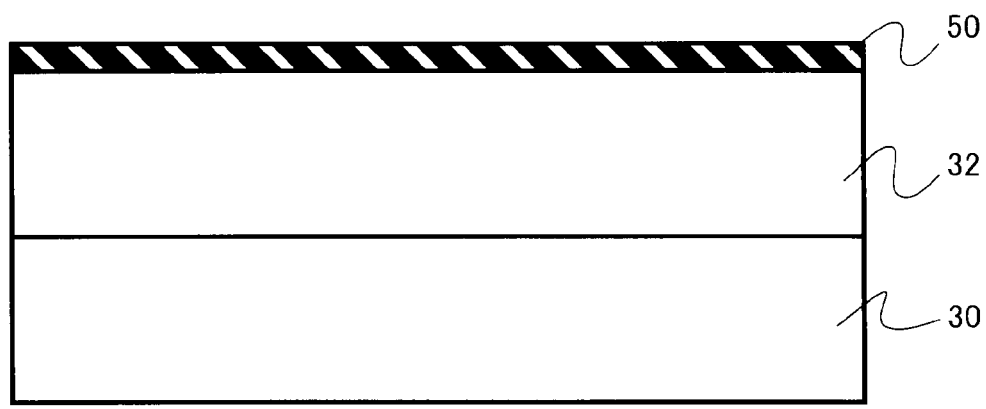

As shown in FIG. 4B, a thermal oxide film 50 is formed on the surface of the n-type epitaxial layer 32 after the pits are removed. The thermal oxide film 50 is formed through heat treatment at 1050° C. for 2 hours in an atmosphere containing water vapor, for example. The thermal oxide film 50 is a so-called sacrifice oxide film.

By forming the thermal oxide film 50, a process-strained layer after polishing is removed. However, after the formation of the thermal oxide film 50, undulation of the wafer surface is larger than that before the formation of the thermal oxide film 50 for concern about an influence on semiconductor element characteristics, in particular, the reliability of the gate electrode 40 of the MOSFET.

It is effective to perform the heat treatment in a water vapor atmosphere to reduce undulation generated after the formation of the thermal oxide film 50. Therefore, the thermal oxide film 50 is desirably formed in the water vapor atmosphere.

Since pits on the surface are removed in the above step of polishing, generation of a defect having a pit as a nucleation center is suppressed in the formation of the thermal oxidation film.

Figure 4C:
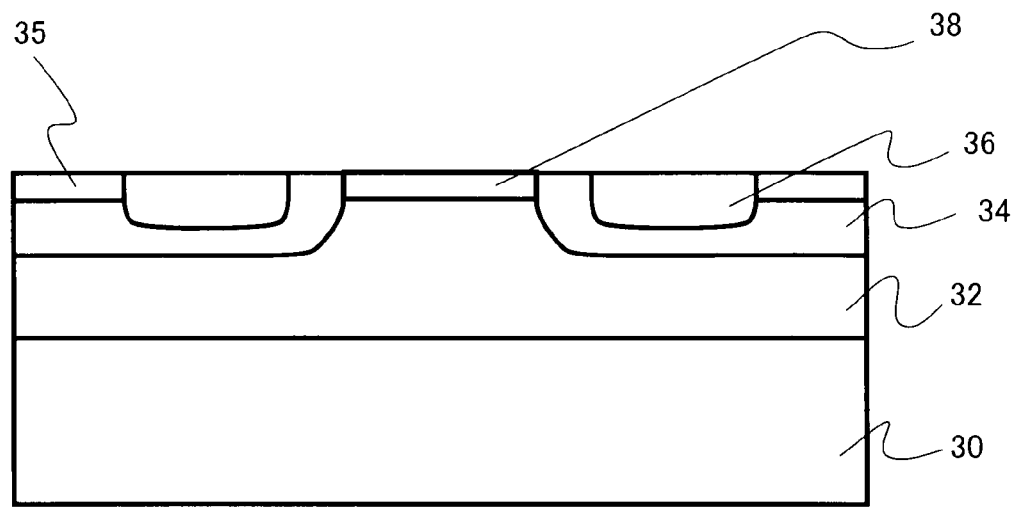

The thermal oxide film 50 is chemically removed as shown in FIG. 4C. For example, the thermal oxide film 50 is removed by dissolving with an ammonium fluoride aqueous solution.

The p-type base regions 34 are formed in the surface of the n-type epitaxial layer 32. More specifically, a photoresist is coated on the n-type epitaxial layer 32. After prebaking is performed, the photoresist is exposed by using a glass mask and developed to form an alignment mark. After postbaking, reactive ion etching is performed to pattern the alignment mark.

Thereafter, an SiO$_2$ film is deposited by a CVD method after the photoresist is removed, and then a photoresist is coated on the SiO$_2$ again. After prebaking is performed, the photoresist is exposed by using a glass mask and developed to pattern the SiO$_2$ film. After postbaking is performed, reactive ion etching is performed to expose regions to be the p-type base regions 34.

In this state, p-type impurities such as aluminum (Al) is ion-implanted by using the SiO$_2$ film as a mask material. As conditions used at this time, a substrate temperature is set to 500° C., and a dose is $3 \times 10^{14}/cm^2$. In this manner, the p-type base regions 34 are formed. Thereafter, the SiO$_2$ film used as a mask material is removed.

Then, the n$^+$-type source regions 36 are formed. More specifically, after an SiO$_2$ film is deposited by a CVD method, a photoresist is coated on the SiO$_2$ film again. After prebaking is performed, the photoresist is exposed by using a glass mask and developed to pattern the SiO$_2$ film. After postbaking is performed, reactive ion etching is performed to expose regions to be the p-type base regions 34.

In this state, n-type impurities such as phosphorous (P) is ion-implanted by using the SiO$_2$ film as a mask material. As conditions used at this time, a substrate temperature is set to 500° C., and a dose is $1 \times 10^{15}/cm^2$. In this manner, the n$^+$-type source regions 36 are formed. Thereafter, the SiO$_2$ film used as a mask material is removed.

Thereafter, n$^-$-type surface channel layer 38 is formed. More specifically, after an SiO$_2$ film is deposited by a CVD method, a photoresist is coated on the SiO$_2$ film again. After prebaking is performed, the photoresist is exposed by using a glass mask and developed to pattern the SiO$_2$ film. After postbaking is performed, reactive ion etching is performed to expose regions to be the n$^-$-type surface channel layer 38.

In this state, n-type impurities such as nitrogen (N) is ion-implanted by using the SiO$_2$ film as a mask material. As conditions used at this time, a substrate temperature is set to 500° C., and a dose is $4 \times 10^{14}/cm^2$. In this manner, the n$^-$-type surface channel layer 38 is formed. Thereafter, the SiO$_2$ film used as a mask material is removed.

Then, the p-type contact regions 35 are formed in the surface part of the p-type base regions 34. More specifically, after an SiO$_2$ film is deposited by a CVD method, a photoresist is coated on the SiO$_2$ film again. After prebaking is performed, the photoresist is exposed by using a glass mask and developed to pattern the SiO$_2$ film. After postbaking is performed, reactive ion etching is performed to expose only regions to be in contact with the n$^+$-type source regions 36, in the p-type base regions 34.

In this state, p-type impurities such as aluminum is ion-implanted by using the SiO$_2$ film as a mask material. As conditions used at this time, a substrate temperature is set to 500° C., and a dose is $1 \times 10^{15}/cm^2$. In this manner, the p-type contact regions 35 are formed. Thereafter, the SiO$_2$ film used as a mask material is removed.

The impurities ion-implanted in the n-type epitaxial layer 32 are activated. A surface of the thermal oxide film 22 is covered with a graphite cap (not shown). The graphite cap is formed by coating a photoresist on the surface, removing a solvent and hardening the photoresist by prebaking, and keeping at 800° C. for 60 minutes so as to graphitize.

Thereafter, heat treatment to activate the impurities implanted through the ion implantation is performed. This heat treatment is performed at 1650° C. for 10 minutes in an argon atmosphere, for example. Thereafter, the graphite cap is removed in a stream of oxygen, and then oxygen asking is performed not to leave a residual.

Since pits in the surface are removed in the previous step of polishing, a defect having a pit as a nucleation center is suppressed from occurring in the heat treatment.

Figure 4D:
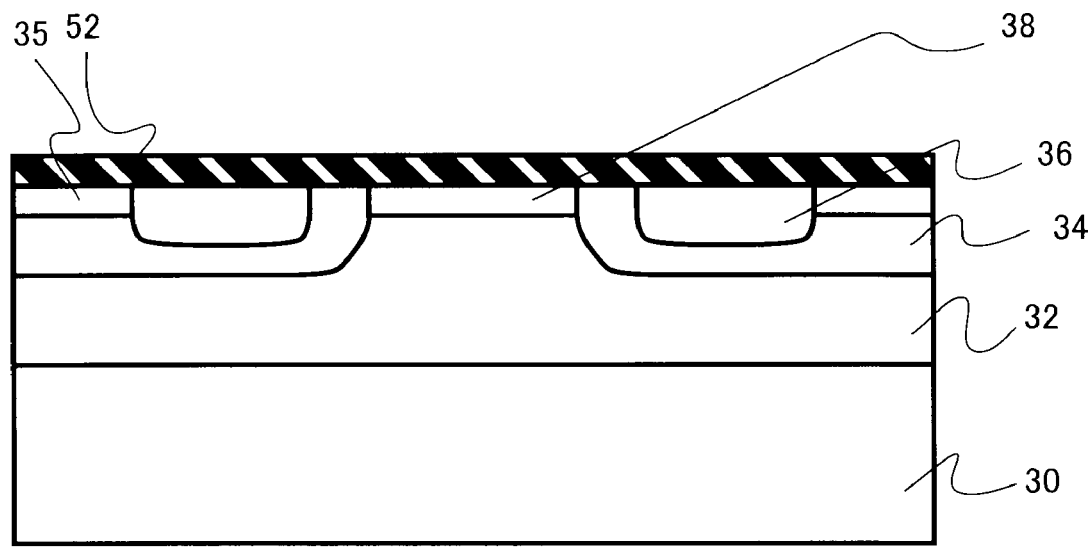

As shown in FIG. 4D, a thermal oxide film 52 is formed on the surface of the n-type epitaxial layer 32. The thermal oxide film 52 is formed at 1050° C. in an atmosphere containing water vapor to have a thickness of about 40 nm, for example. The thermal oxide film 50 is also a so-called sacrifice oxide film.

By forming the thermal oxide film 52, a damage layer formed by ion implantation if removed. However, as described above, after the formation of the thermal oxide film 52, undulation of the wafer surface is larger than that before the formation of the thermal oxide film 52 for concern about an influence on semiconductor element characteristics.

It is effective to perform the heat treatment in a water vapor atmosphere also to reduce undulation generated after the formation of the thermal oxide film 52. Therefore, the thermal oxide film 52 is desirably formed in the water vapor atmosphere.

Since pits on the surface are removed in the above step of polishing, a defect having a pit as a nucleation center in the formation of the thermal oxidation film is suppressed from occurring.

Figure 4E:
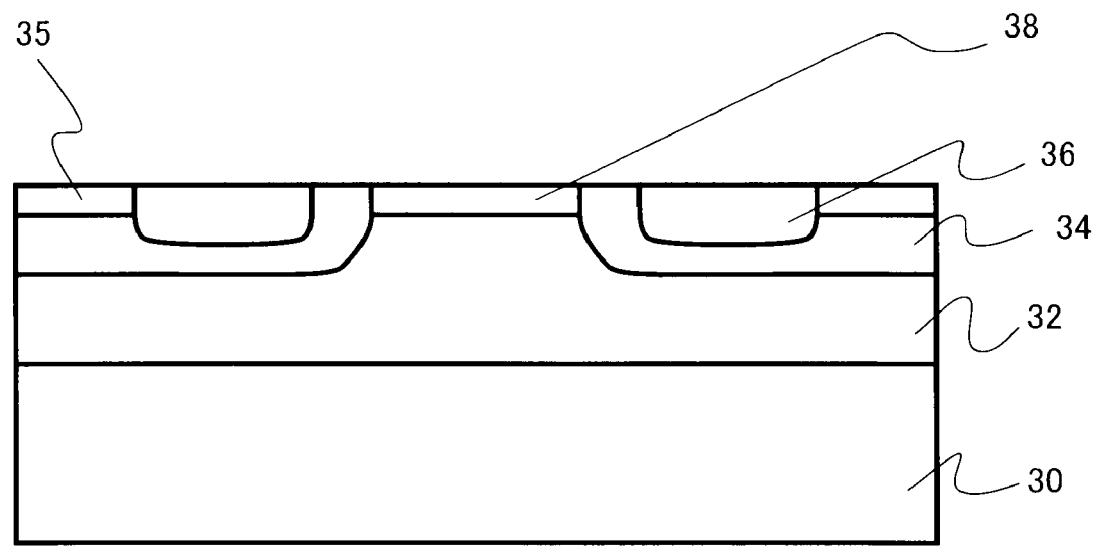

The thermal oxide film 52 is chemically removed as shown in FIG. 4E. For example, the thermal oxide film 52 is removed by dissolving with an ammonium fluoride aqueous solution.

Figure 4F:
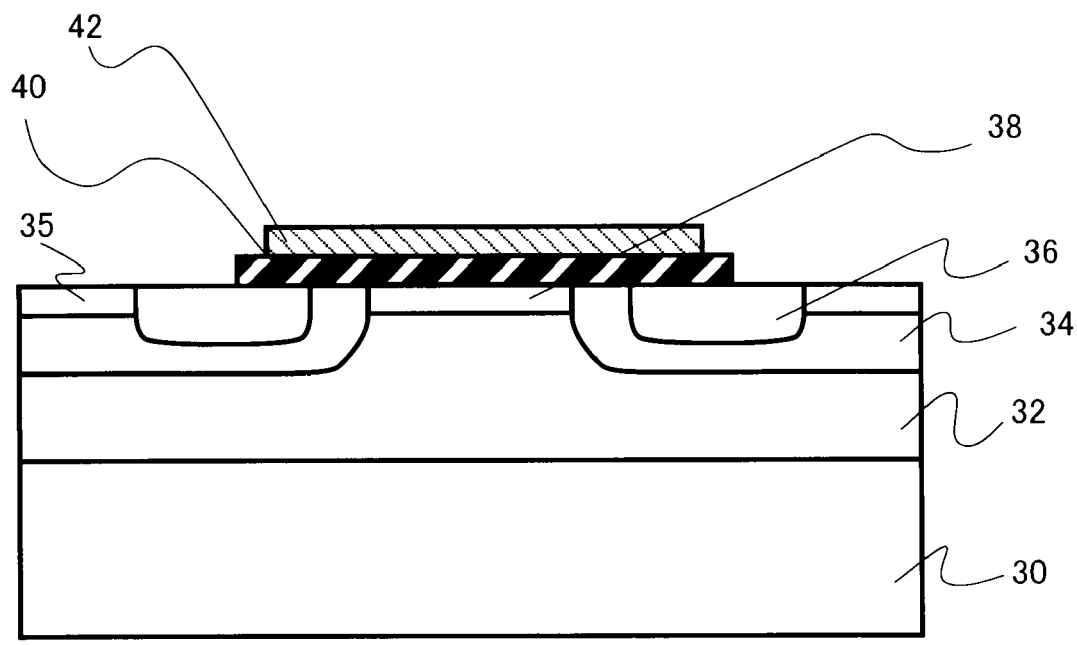

As shown in FIG. 4F, the gate insulating film 40 is formed on the surface of the n-type epitaxial layer 32. The gate insulating film 40 is formed through heat treatment at 1100° C. in a dry atmosphere, for example. By making a wet atmosphere by, for example, a pyrogenic method using hydrogen and oxygen when the temperature is decreased, an interface state density of an oxide film can be effectively reduced, and channel mobility can be increased.

On the gate insulating film 40, polysilicon is deposited at a substrate temperature of 600° C. by a low pressure CVD method. The polysilicon is patterned to form the gate electrode 42.

Figure 4G:
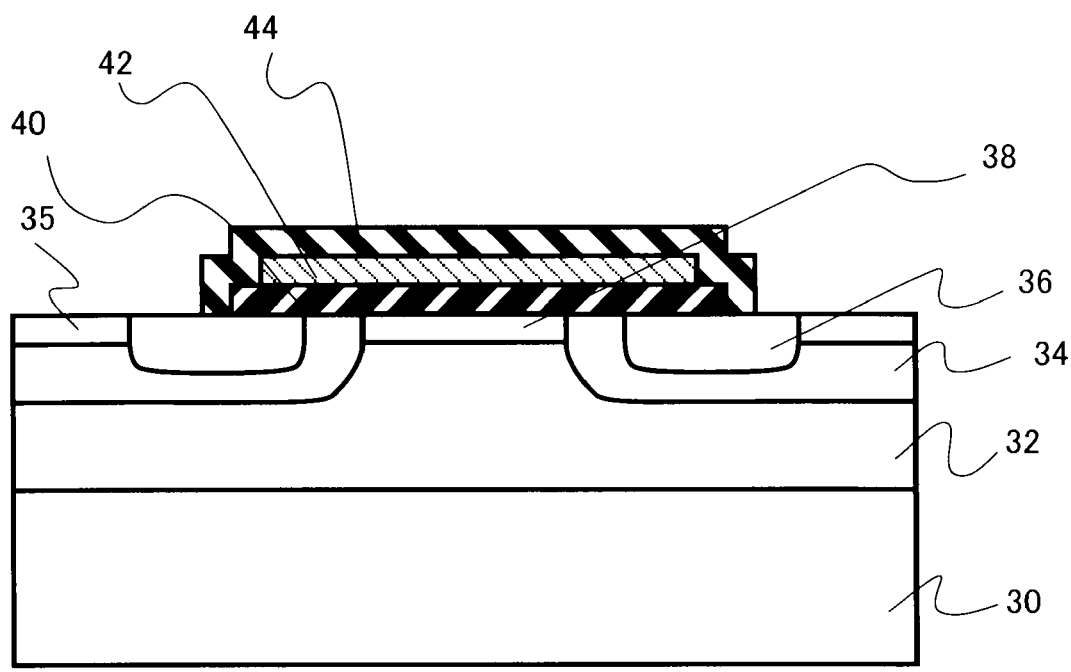

Thereafter, as shown in FIG. 4G, an unnecessary portion of the gate electrode 40 is removed, and then a low-temperature deposition oxide film such as the $SiO_2$ insulating interlayer 44 made of $SiO_2$ is deposited on the gate electrode 40. Thereafter, annealing is performed at 1000° C.

Thereafter, the source electrode 46 and the drain electrode are formed by sputtering at room temperature, and then the resultant structure is sintered at 1000° C. In this manner, a vertical power MOSFET shown in FIG. 3 is manufactured.

According to the embodiment, pits on an epitaxial layer surface are removed, and thus defects to be nucleation centers of dislocation loops, extended dislocations, and the like generated near the surface during the heat treatment can be reduced. Therefore, a vertical power MOSFET that is excellent especially in reliability of a gate insulating film can be manufactured.

Third Embodiment

A method of manufacturing a semiconductor device according to the embodiment includes: a step of epitaxially growing a silicon carbide semiconductor layer of a first conductivity type on a silicon carbide semiconductor substrate; a step of determining a defect position to be a leakage current source of the silicon carbide semiconductor layer; a step of ion-implanting impurities in the defect position to form impurity layer of a second conductivity type; and a step of forming an electrode pad on the silicon carbide semiconductor layer.

As a semiconductor device, a junction barrier Schottky diode (to be also simply referred to as a Schottky diode hereinafter) will be exemplified. According to the embodiment, a defect position to be a leakage current (leakage current) source is determined after an element is formed during the manufacturing process. Then, the position is inactivated during the manufacturing process. More specifically, the position is prevented from functioning as a device region. Accordingly, reverse-bias leakage current of a Schottky diode is suppressed, and Schottky diodes can be manufactured at a high yield.

Defects to be leakage current sources after an element is formed are, for example, crystal defects or unevenness of a surface of a silicon carbide semiconductor layer due to the crystal defects or the like.

Figure 5A:
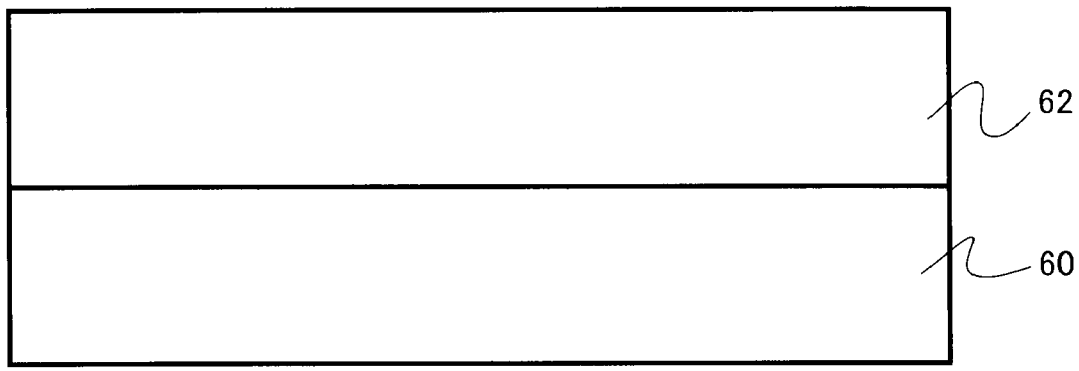
FIGS. 5A to 5G are process sectional views showing a method of manufacturing a semiconductor device according to a third embodiment.

FIGS. 5A to 5E are process sectional views showing a method of manufacturing a semiconductor device according to the embodiment. FIGS. 5F and 5G are top views showing the method of manufacturing a semiconductor device according to the embodiment. As shown in FIG. 5A, for example, an $n^+$-type substrate 60 of 4H—SiC (0001) Si surface containing N as impurities is prepared. On the $n^+$-type substrate 60, the n-type epitaxial layer 62 having a nitrogen concentration lower than that of the $n^+$-type substrate 60, for example, is formed by epitaxial growth.

A growth film thickness of the n-type epitaxial layer 62 is about 10 μm to 15 μm, for example. A growth film thickness in the epitaxial growth is set based on a designed film thickness determined by endurance voltage design of a Schottky diode.

Thereafter, on the n-type epitaxial layer 62, an alignment mark is formed by using, for example, a known lithography technique and an RIE technique.

The step of determining a defect position to be a leakage current source of the n-type epitaxial layer 62 as a silicon carbide semiconductor layer is performed by using a conductive interatomic microscope. For example, a surface of the n-type epitaxial layer 62 is scanned by a probe of the conductive interatomic microscope to monitor a capacitance with the n-type epitaxial layer 62, and an abnormal position is determined as a defect position to be a leakage current source after the element is formed. The defect position is determined as coordinates from the alignment mark, for example. In this manner, current mapping data is formed.

Figure 5B:
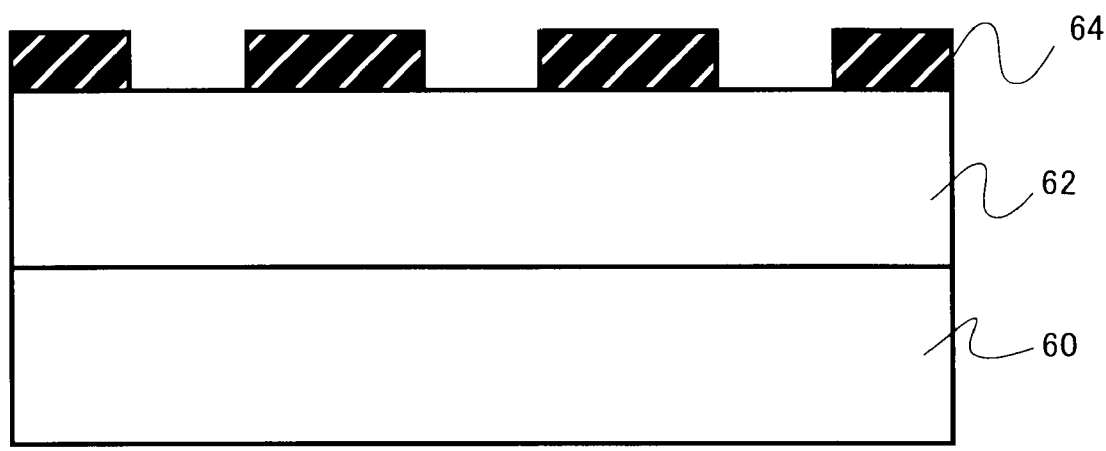

As shown in FIG. 5B, a silicon oxide film 64 to be a mask for later impurity ion implantation is deposited to have a thickness of about 1.5 μm, for example, by a CVD method or the like. A line-and-space photoresist pattern (not shown) is formed by a known stepper. This pattern serves as a pattern of a p-type ion implantation region in a junction barrier Schottky diode structure. The silicon oxide film 64 is etched by, for example, an RIE method using the photoresist as a mask.

Figure 5C:
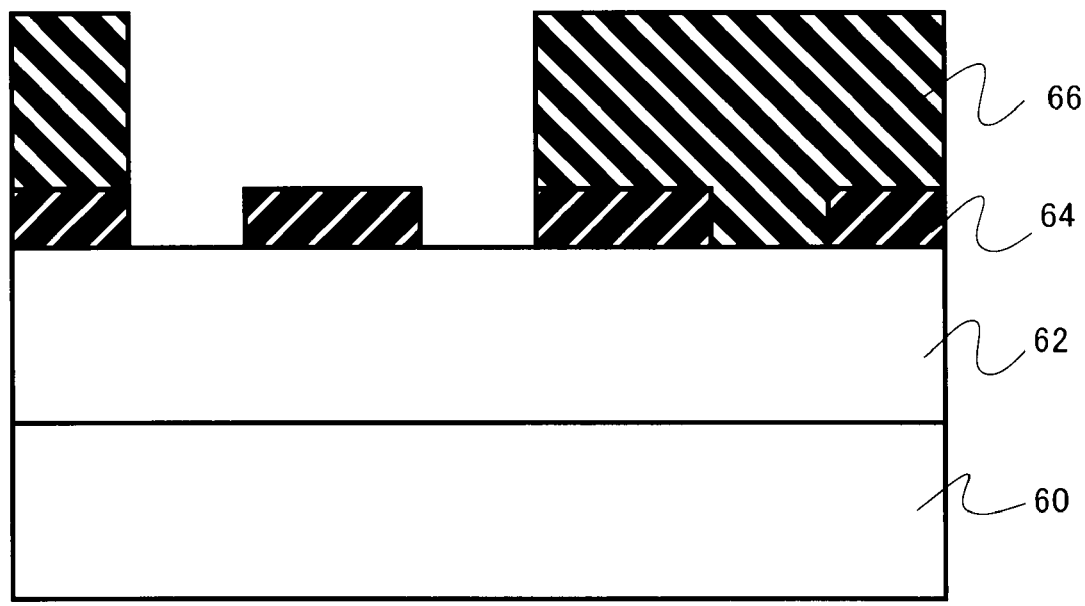

The photoresist is removed. Thereafter, a photoresist 66 is patterned by using a stepper such that the determined defect position is opened by a round pattern having a diameter of 10 μm as shown in FIG. 5C, based on the current mapping data previously obtained. This patterning can be realized by, for example, preparing a mask having an opening of about 10

μm-square opening, moving the mask at pitches each equal to the size of the opening, and exposing only a portion of the determined defect position.

Thereafter, the silicon oxide film 64 is etched by, for example, an RIE method using the photoresist 66 as a mask. The photoresist 66 is peeled.

In this case, the pattern of the p-type ion implantation region and the pattern of the defect position are formed by using different photomasks as masks. However, when both of the patterns are formed using a single photoresist by double-exposing the same photomask, the patterns can be formed through one lithography step. Since a silicon oxide film 54 can be etched at a time by RIE, the process can be simplified.

Figure 5D:
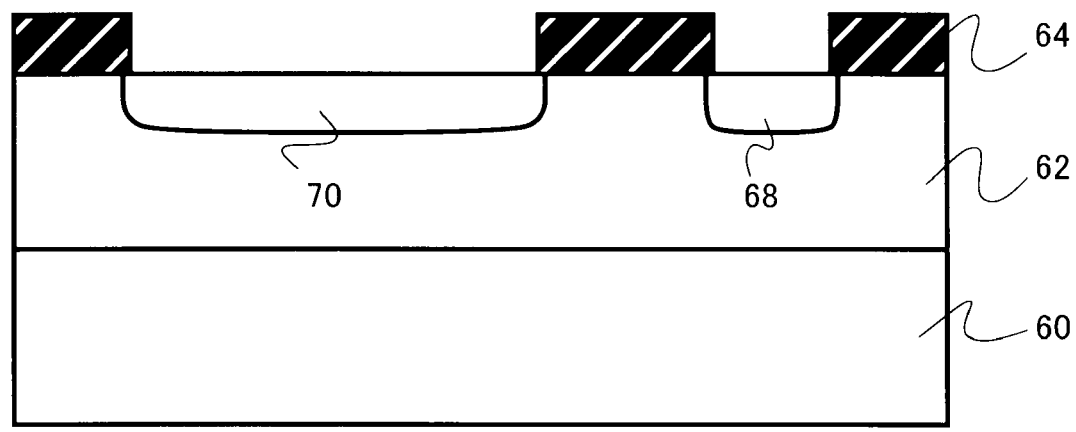

As shown in FIG. 5D, for example, multistep ion implantation of aluminum is performed by using the silicon oxide film 64 as a mask. In this manner, a p-type ion implantation region 68 for a junction barrier Schottky diode structure and a p-type impurity layer 70 to inactivate a defect position are formed.

FIG. 5F is a top view of patterns of the p-type ion implantation region 68 and the p-type impurity layer 70. The p-type ion implantation region 68 and the p-type impurity layer 70 have impurity concentrations of $1 \times 10^{17}/cm^3$. The pattern of the p-type impurity layer 70 need not be always circular as shown in FIG. 5F. For example, a line pattern as shown in FIG. 5G may be used.

Figure 5E:
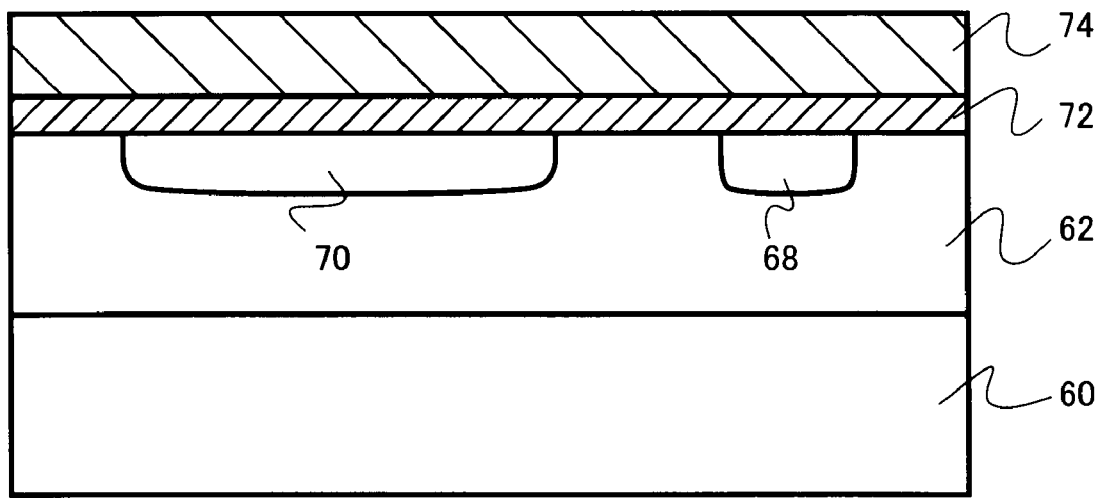
Figure 5F:
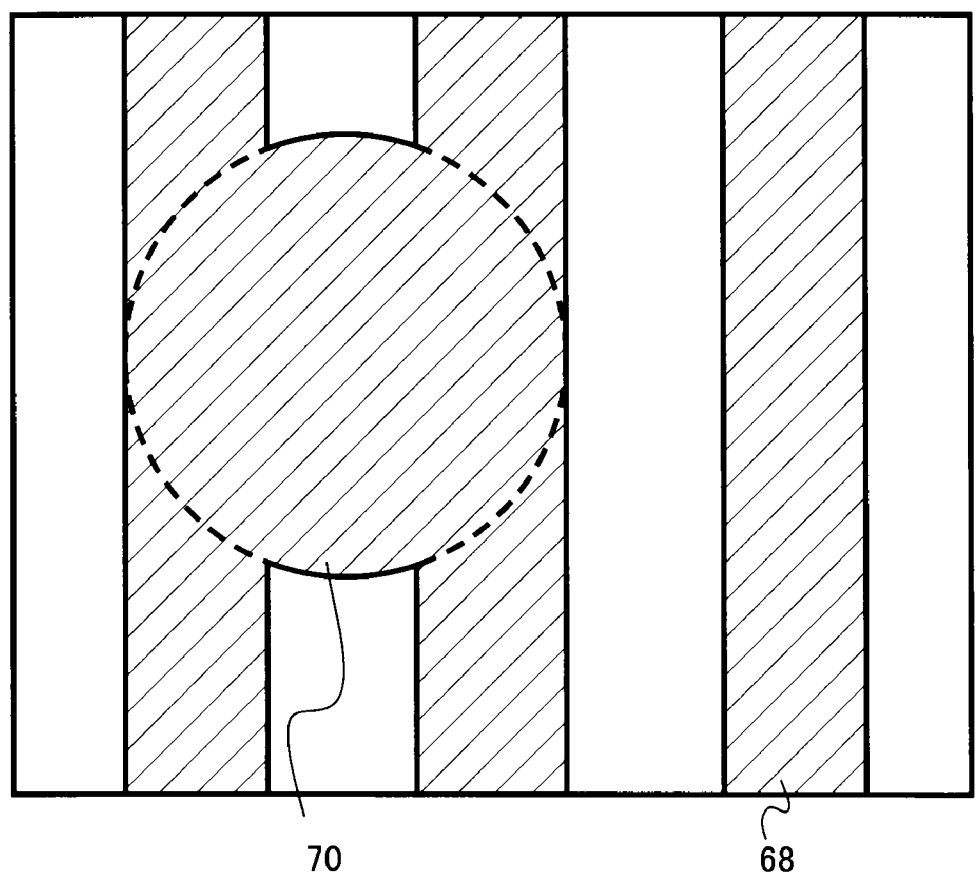
Figure 5G:
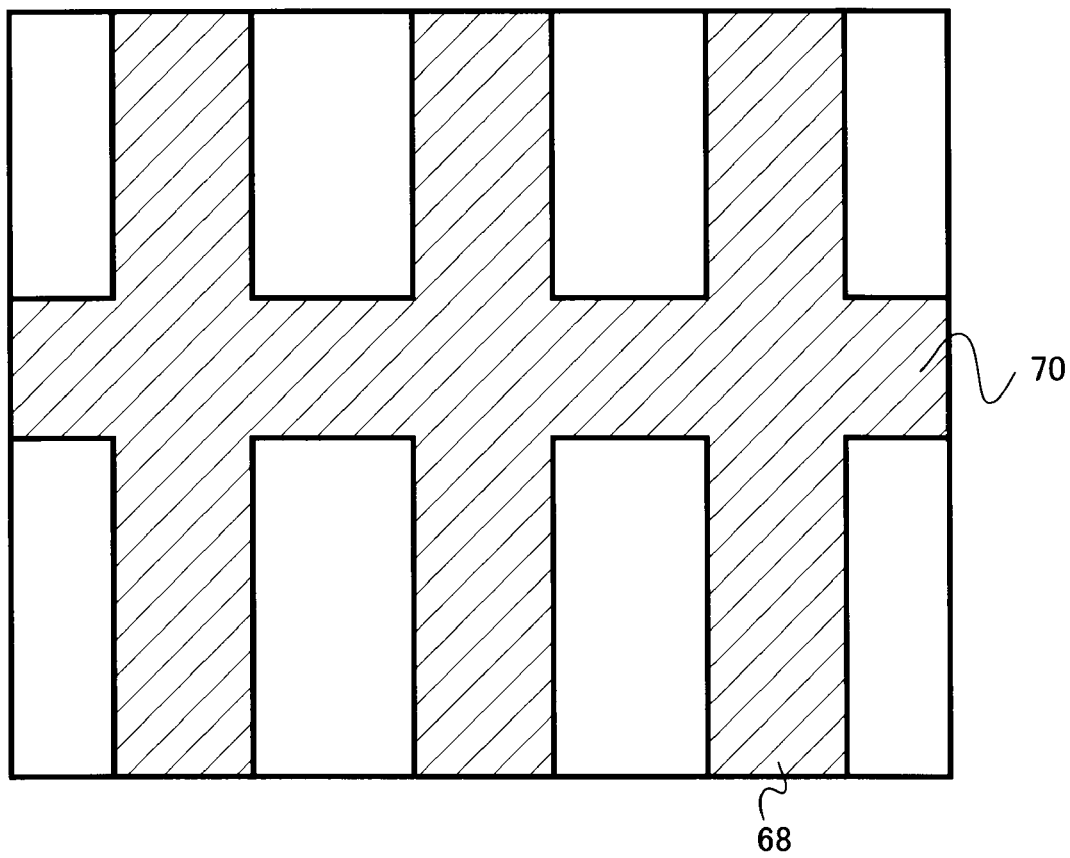

As shown in FIG. 5E, the silicon oxide film 64 is removed, a Schottky electrode material 72 is formed on a surface of the n-type epitaxial layer 62, and an electrode pad 74 is formed on the Schottky electrode material 72.

For example, a titanium film is formed on the surface of the n-type epitaxial layer 62 by a sputtering method. An aluminum film is formed on the titanium film by a sputtering method.

Thereafter, the resultant structure is coated with a photoresist, prebaked, and exposed by using a photomask. After development, postbaking is performed. By using such patterned photoresist as a mask material, the aluminum film on portions without photoresist is etched by a chlorine-based dry etching apparatus. Fluorine-based dry etching is subsequently performed to leave titanium on only the Schottky electrode surface.

Thereafter, the photoresist is removed. In this manner, the junction barrier Schottky diode according to the embodiment is manufactured.

According to the embodiment, a p-type impurity layer is formed on a defect position to be a leakage current source during the manufacturing process to inactivate the position. For this reason, reverse-bias leakage current of a Schottky diode is suppressed, and Schottky diodes can be manufactured at a high yield.

As an example, through the manufacturing process, a large-scale junction barrier Schottky diode having a 10 mm×10 mm active region was manufactured. At this time, a yield was 80% or more. In contrast to this, large-scale junction barrier Schottky diode was manufactured without the step of determining a defect position and the step of forming an impurity layer on the defect position as a comparative example. A yield of the comparative example was 0%. Therefore, it is clear that a great increase in yield can be realized according to the embodiment.

Fourth Embodiment

In a method of manufacturing a semiconductor device according to the embodiment, instead of determining a defect position by a conductive interatomic microscope as performed in the third embodiment, a defect position is determined by using a metal oxide arranged on a silicon carbide semiconductor layer. More specifically, before the step of determining a defect position, a step of forming a plurality of metal electrodes each having an area smaller than that of an electrode pad of a junction barrier Schottky diode on a silicon carbide semiconductor layer is provided. In the step of determining a defect position, a current between each of the plurality of metal electrodes and the silicon carbide semiconductor layer is measured. Contents that are the same as those described in the third embodiment will not be repeated.

Figure 6:
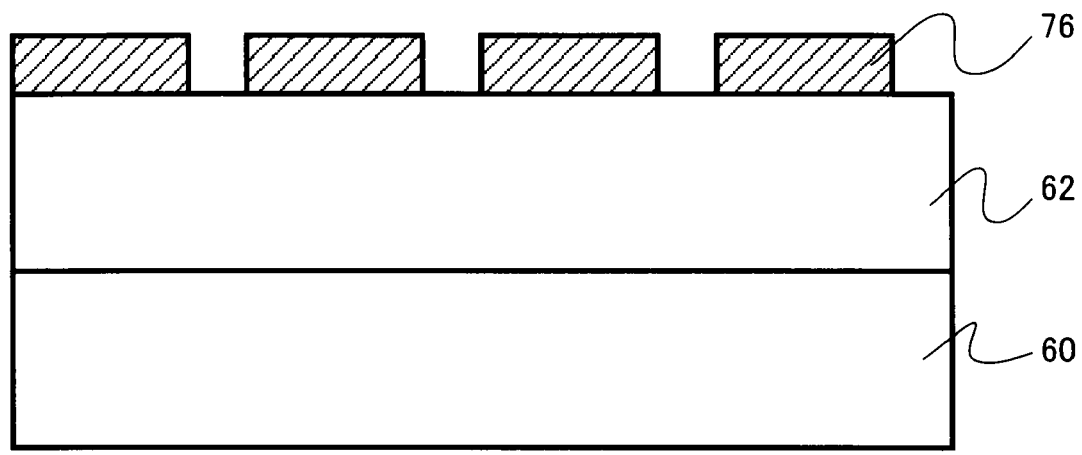
FIG. 6 is a process sectional view showing a method of manufacturing a semiconductor device according to a fourth embodiment.

FIG. 6 is a process sectional view showing a method of manufacturing a semiconductor device according to the embodiment. For example, the $n^+$-type substrate 60 of 4H—SiC (0001) Si surface containing N as impurities is prepared. On the $n^+$-type substrate 60, the n-type epitaxial layer 62 having a nitrogen concentration lower than that of, for example, the $n^+$-type substrate 60 is formed by epitaxial growth. Thereafter, for example, an aluminum film is formed on a surface of the n-type epitaxial layer 62 by a sputtering method. Thereafter, the resultant structure is coated with a photoresist, prebaked, and exposed by using a photomask. After development, postbaking is performed.

By using such patterned photoresist as a mask material, the aluminum film on portions without photoresist is etched by a chlorine-based dry etching apparatus. In this manner, a plurality of metal electrodes 76 each having an area smaller than an electrode pad are formed on the n-type epitaxial layer 62.

A current between each of the plurality of metal electrodes 76 and the n-type epitaxial layer 62 serving as a silicon carbide semiconductor layer is measured. More specifically, for example, a current is measured using one of the metal electrodes 76 as one electrode, and the $n^+$-type substrate 60 as the other electrode. With this measurement, a position having an abnormal current value is determined as a defect position. Based on the measurement, current mapping data is formed.

Thereafter, the metal electrodes 76 are removed by etching. The subsequent step of forming a p-type impurity layer for inactivation on the determined defect position is the same as that in the third embodiment.

In the embodiment, the metal electrodes 76 to identify a defect position are desirably formed to minimize an influence on later device characteristics. More specifically, unevenness and damage generated on the surface of the n-type epitaxial layer 62 are desirably removed by the formation of the metal electrodes 76.

Therefore, after the metal electrodes 76 are removed by etching, sacrifice oxidation is desirably performed to about 50 nm. Alternatively, the surface is desirably polished by chemical mechanical polishing (CMP).

According to the embodiment, the same effect as that in the third embodiment can also be obtained.

Fifth Embodiment

In a method of manufacturing a semiconductor device according to the embodiment, an insulating film is selectively formed on a defect position to inactivate the defect position unlike the third embodiment in which a defect position to be a leakage current source is inactivated by the p-type impurity layer. More specifically, the method according to the fifth embodiment includes: a step of epitaxially growing a silicon carbide semiconductor layer on a silicon carbide semiconductor substrate; a step of determining a defect position to be a leakage current source of the silicon carbide semiconductor layer; a step of selectively forming an insulating film on the defect position; and a step of forming an electrode pad on the silicon carbide semiconductor layer and the insulating film. Hereinafter, contents same as those described in the third embodiment will not be repeated.

Figure 7A:
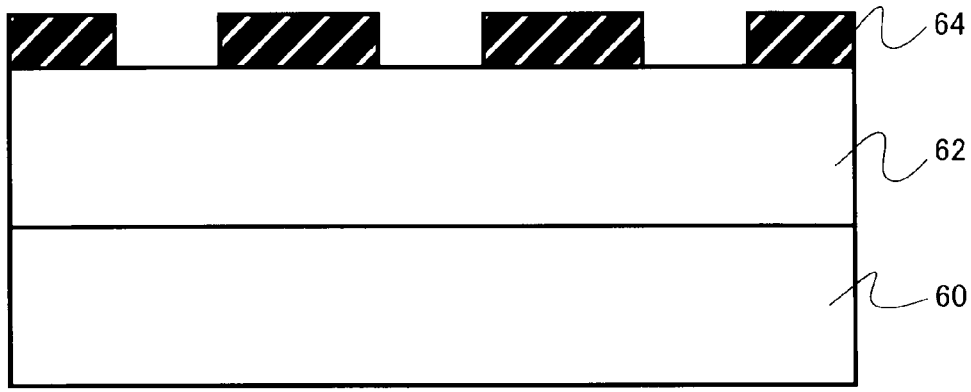
FIGS. 7A to 7D are process sectional views showing a method of manufacturing a semiconductor device according to a fifth embodiment.

FIGS. 7A to 7D are process sectional views showing the method of manufacturing a semiconductor device according to the embodiment. As shown in FIG. 7A, for example, the $n^+$-type substrate 60 of 4H—SiC(0001) Si surface containing N as impurities is prepared. On the $n^+$-type substrate 60, the n-type epitaxial layer 62 having a nitrogen concentration lower than that of the $n^+$-type substrate 60, for example, is formed by epitaxial growth.

Thereafter, on the n-type epitaxial layer 62, an alignment mark is formed by using, for example, a known lithography technique and an RIE technique.

The step of determining a defect position to be a leakage current source of the n-type epitaxial layer 62 as a silicon carbide semiconductor layer is performed by using a conductive interatomic microscope.

A silicon oxide film 64 to be a mask for later impurity ion implantation is deposited to have a thickness of about 1.5 μm, for example, by a CVD method or the like. A line-and-space photoresist pattern (not shown) is formed by a known stepper. This pattern serves as a pattern of a p-type ion implantation region in a junction barrier Schottky diode structure. The silicon oxide film 64 is etched by, for example, an RIE method using the photoresist as a mask.

Thereafter, the silicon oxide film 64 is etched by, for example, an RIE method by using the photoresist as a mask. The photoresist 66 is peeled.

Figure 7B:
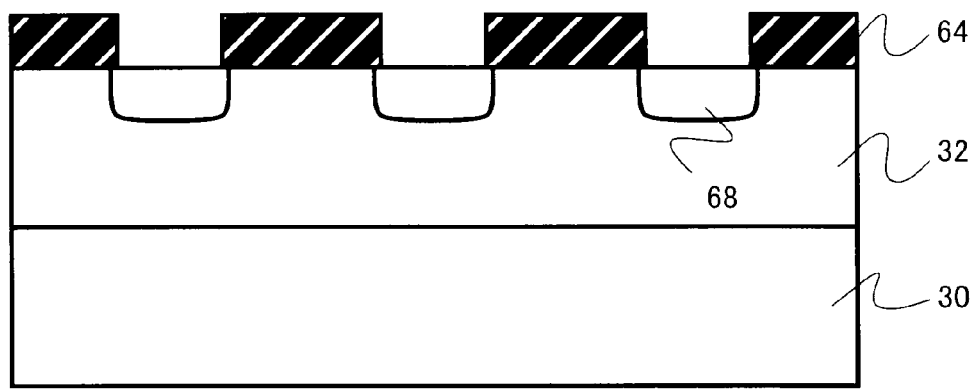

As shown in FIG. 7B, for example, multistep ion implantation of aluminum is performed by using the silicon oxide film 64 as a mask. In this manner, the p-type ion implantation region 68 for a junction barrier Schottky diode structure is formed.

Figure 7C:
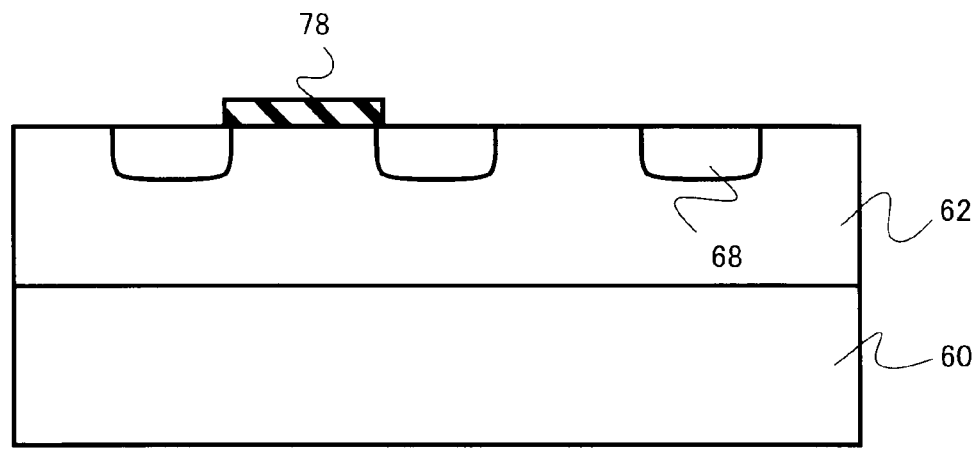

Thereafter, for example, an insulating film 78 made of a silicon oxide film is formed on a determined defect position as shown in FIG. 7c, based on the current mapping data previously obtained. The insulating film 78 is formed by covering a defect position with a silicon oxide film by, for example, an ink-jet system.

The means of forming the insulating film 78 is not limited to the ink-jet system but the insulating film 78 may also be formed by a method in which, for example, a silicon oxide film deposited on the n-type epitaxial layer 62 by a CVD method is patterned to leave the silicon oxide film on only a determined defect position.

For example, the photoresist 66 is patterned to leave a determined defect position as, for example, a 10-μm-square pattern by using a stepper. This patterning can be realized by, for example, preparing a mask having an opening of about 10-μm-square, and moving the mask at pitches of about 10 μm not to expose only a portion of the determined defect position.

Figure 7D:
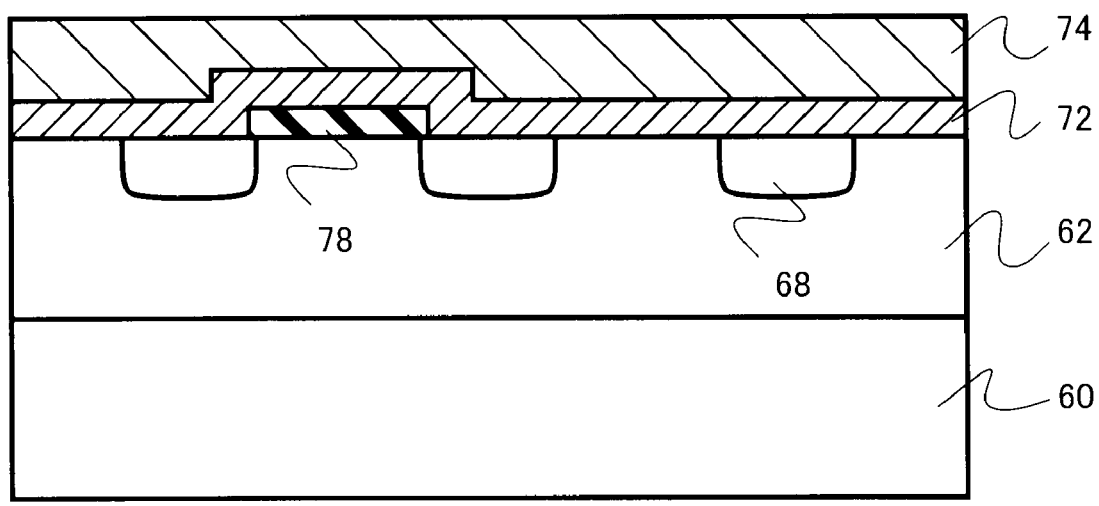

As shown in FIG. 7D, the Schottky electrode material 72 is formed on the n-type epitaxial layer 62 and the insulating film 78, and the electrode pad 74 is formed on the Schottky electrode material 72.

Thereafter, the Schottky electrode material 72 and the electrode pad 74 are patterned, whereby a junction barrier Schottky diode according to the embodiment is manufactured.

According to the embodiment, an insulating film is selectively formed on a defect position to be a leakage current source during the manufacturing process to inactivate the position. For this reason, reverse-bias leakage current of a Schottky diode is suppressed, and Schottky diodes can be manufactured at a high yield.

Sixth Embodiment

A method of manufacturing a semi conductor device according to the embodiment is different from that in the fourth embodiment in that the plurality of metal electrodes which are used during the manufacturing process to identify a defect position to be a leakage current source in the fourth embodiment are not removed and used in a final device structure. Also, an insulating film used to inactivate a defect position is formed on the metal electrodes rather than on a surface of a silicon carbide semiconductor layer. More specifically, in the step of forming an insulating film, an insulating film is selectively formed on the metal electrode on a defect position determined in the step of determining a defect position. Contents same as those described in the fourth and fifth embodiments will not be repeated.

Figure 8A:
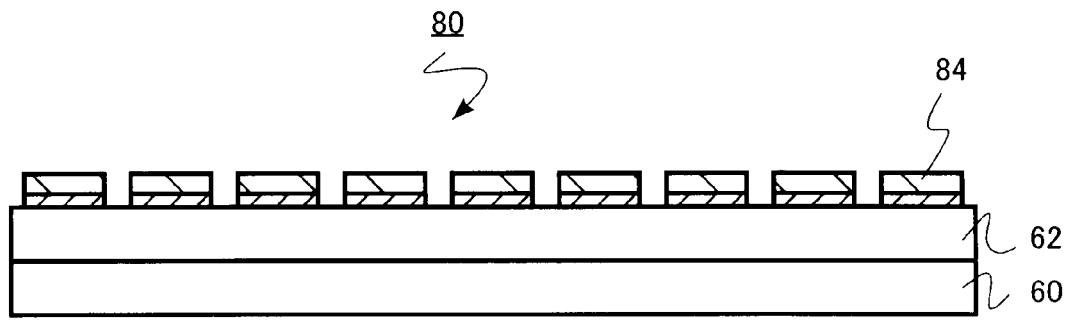
FIGS. 8A to 8C are views showing a method of manufacturing a semiconductor device according to a sixth embodiment.
Figure 8A:
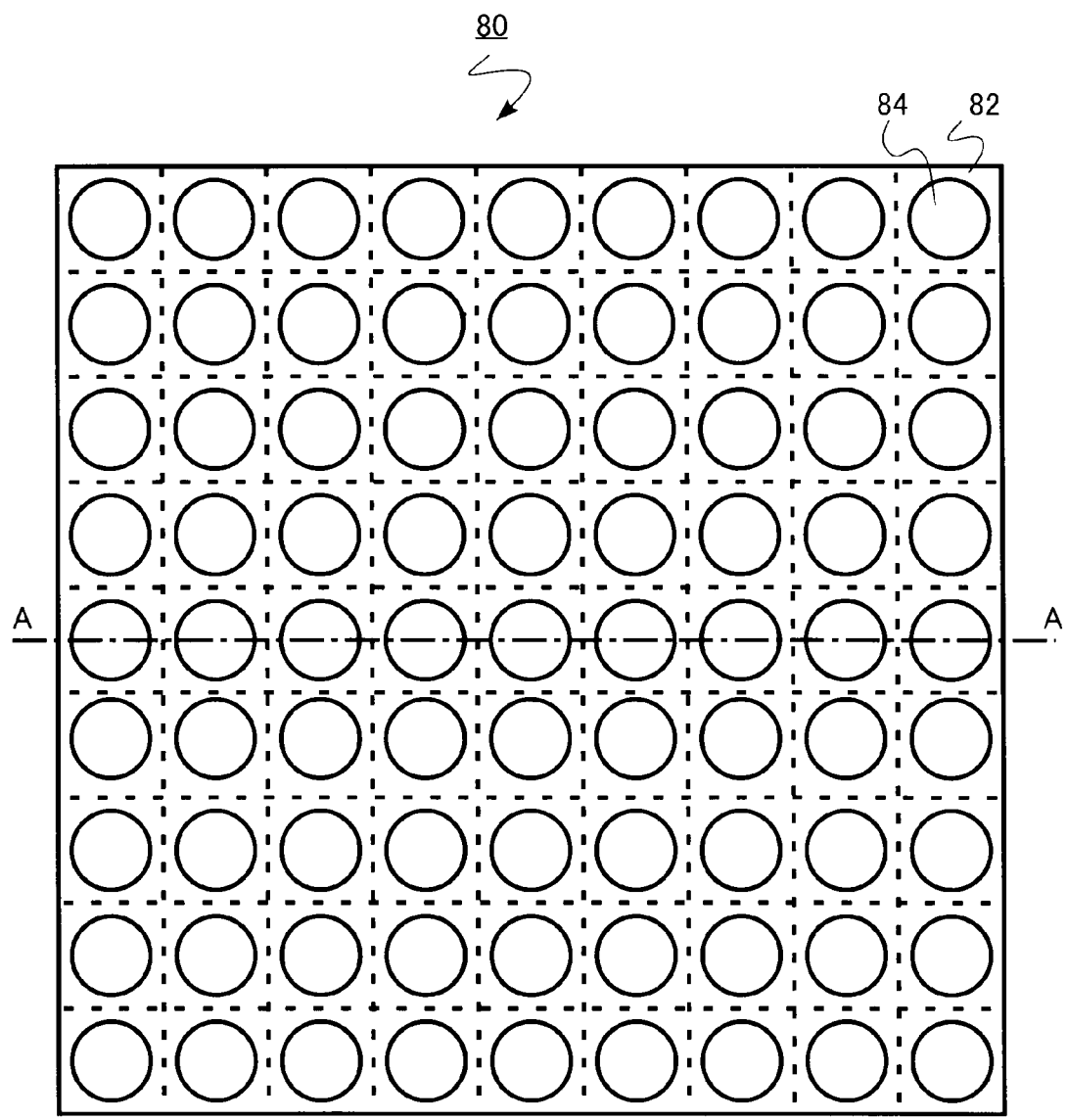
Figure 8B:
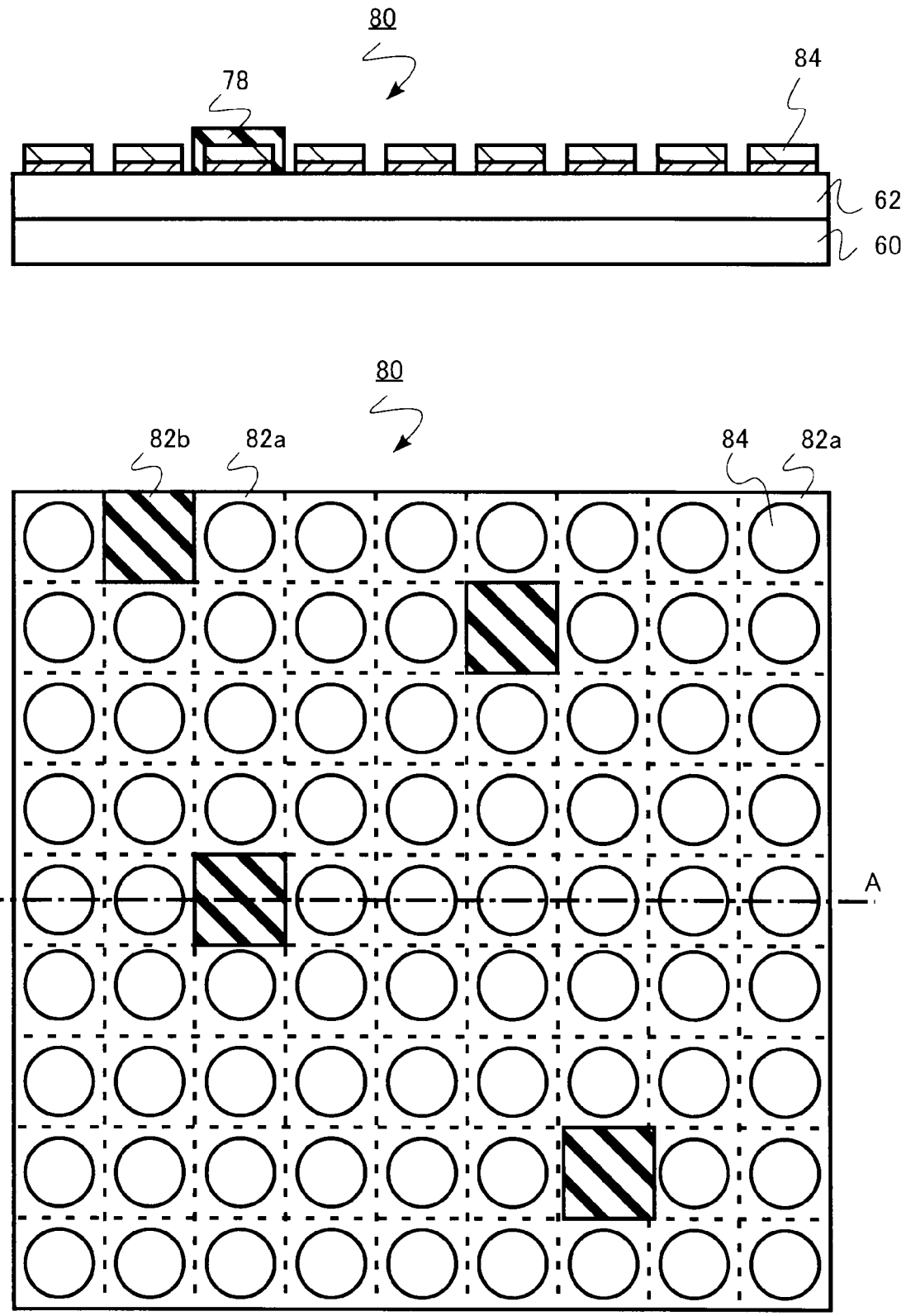
Figure 8C:
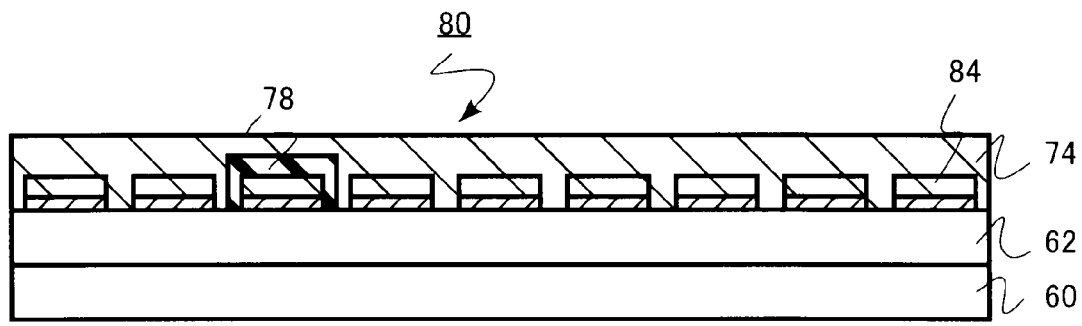
Figure 8C:
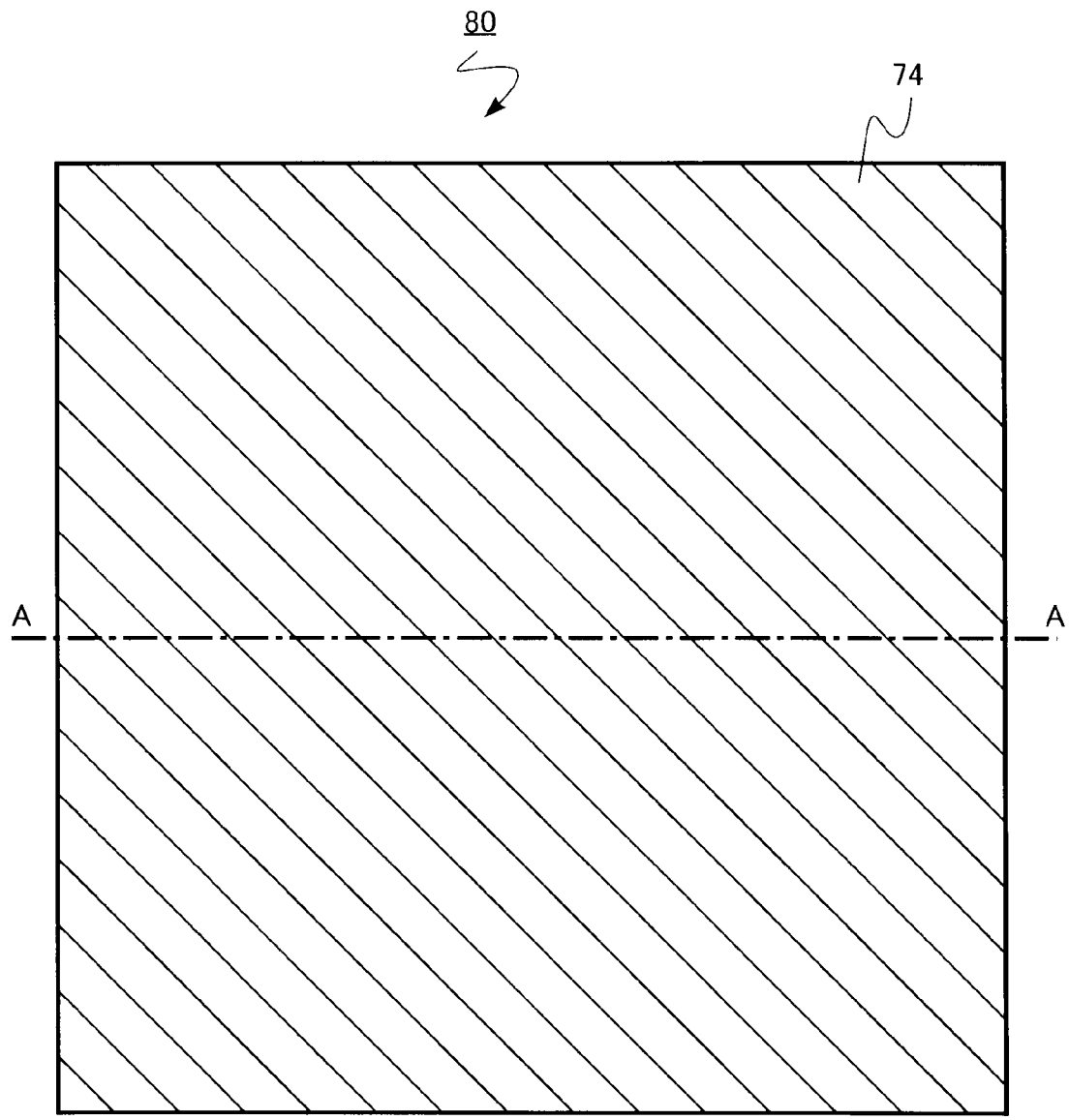

FIGS. 8A to 8C are diagrams showing the method of manufacturing a semiconductor device according to the embodiment. In each of the drawings, an upper view is a sectional view, and a lower view is a top view. The upper views are A-A sectional views of the lower views, respectively. In this case, an example in which a large-scale junction barrier Schottky diode 80 having a size of about 10 mm×10 mm is formed will be explained.

As shown in FIG. 8A, for example, the $n^+$-type substrate 60 of 4H—SiC(0001) Si surface containing N as impurities is prepared. On the $n^+$-type substrate 60, the n-type epitaxial layer 62 having a nitrogen concentration lower than that of, for example, the $n^+$-type substrate 60 is formed by epitaxial growth.

On the n-type epitaxial layer 62, small junction barrier Schottky diodes 82 each having a size of about 300 μm square to 1 mm square are formed in regions in which the large-scale junction barrier Schottky diode 80 is to be formed, by a known method. Although not shown, in each of the junction barrier Schottky diodes 82, a junction terminal structure such as RESURF and a guard ring are configured.

Although not shown, an n-type P (phosphorous) ion implantation layer serving as a channel stop layer is formed on a peripheral portion of the large-scale junction barrier Schottky diode 80. This channel stop layer prevents endurance voltage of the large-scale junction barrier Schottky diode 80 from being deteriorated.

A reverse-bias current between each metal electrode 84 and the n-type epitaxial layer 62 as a silicon carbide semiconductor layer is measured. More specifically, for example, a reverse-bias current is measured using each of the metal electrodes 84 as one electrode, and the $n^+$-type substrate 60 as the other electrode. With this measurement, the junction barrier Schottky diodes 82 are sorted into nondefective elements 82a and defective elements 82b. The defective elements 82b are defect positions to be leakage current sources.

Thereafter, as shown in FIG. 8B, based on information of the nondefective elements 82a and the defective elements 82b previously obtained, for example, the insulating film 78 made of, for example, a silicon oxide film is formed on each of the metal electrodes 84 of the defective elements 82b that are determined defect positions. The insulating film 78 is formed by covering a defect position with a silicon oxide film by, for example, an ink-jet system.

The means of forming the insulating films 78 is not limited to the ink-jet system but the insulating films 78 may also be formed by a method in which, for example, a silicon oxide film deposited on the metal electrodes 84 by a CVD method is patterned to leave the silicon oxide films on determined defect positions.

For example, the photoresist 66 is patterned to leave determined defect positions as patterns having the same size as that of the junction barrier Schottky diode 82 by using stepper. This patterning can be realized by, for example, preparing a mask having openings each having a size equal to that of the junction barrier Schottky diode 82, and the mask is exposed by not to expose only the determined defect positions, i.e., portions of the defective elements 82b while a step-and-repeat at pitches each having a size equal to that of the junction barrier Schottky diode 82.

After the surface is cleaned by reverse sputtering, for example, as shown in FIG. 8C, the aluminum electrode pad 74 is formed by sputtering and subsequent patterning. In this manner, the large-scale junction barrier Schottky diode 80 according to the embodiment is manufactured.

According to the embodiment, an insulating film is selectively formed on defect positions to be leakage current sources during the manufacturing process, so that the positions are inactivated. For this reason, reverse-bias leakage current of a Schottky diode is suppressed, and Schottky diodes can be manufactured at a high yield.

In the embodiment, a junction barrier Schottky diode, in which device characteristics almost the same as those of a final product can be evaluated, is formed and defect positions are identified. More specifically, only junction barrier Schottky diodes, which are nondefective elements, are collected into one module. Therefore, defect positions to be leakage current sources in a product can be excluded at a very high accuracy. For this reason, a high production yield can be realized.

In comparison with a usual method of manufacturing a large-scale junction barrier Schottky diode, the number of additional steps for manufacturing is small. For this reason, an increase in manufacturing cost can be minimized.

The embodiments of the present invention are explained with reference to the concrete examples. The embodiments are, consistently, given as examples, and do not limit the present invention. In the explanations of the embodiments, parts which are not directly required for the explanation of the present invention or the like in the semiconductor device, the method of manufacturing a semiconductor device, and the like are not described. However, necessary elements related to the semiconductor device, the method of manufacturing a semiconductor device, and the like can be arbitrarily selected and used.

For example, titanium is exemplified as a Schottky electrode material. However, other metal material such as nickel, tungsten, molybdenum, or the like can also be applied.

In addition, all semiconductor devices and all methods of manufacturing a semiconductor device which include the elements of the present invention and can be obtained by arbitrarily change of design by a person skilled in the art are included in the spirit and scope of the invention. The spirit and scope of the invention are defined by the appended claims and equivalents thereof.

What is claimed is:

1. A method of manufacturing a semiconductor device, comprising:
    growing epitaxially a silicon carbide semiconductor layer on a silicon carbide semiconductor substrate;
    polishing a surface of the silicon carbide semiconductor layer;
    ion-implanting impurities into the silicon carbide semiconductor layer after the polishing;
    performing a heat treatment to activate the impurities;
    forming a first thermal oxide film on the surface of the silicon carbide semiconductor layer after the performing the heat treatment;
    removing chemically the first thermal oxide film; and
    forming an electrode layer on the silicon carbide semiconductor film.

2. The method according to claim 1, wherein the polishing is performed by chemical mechanical polishing (CMP).

3. The method according to claim 2, wherein an amount of polishing of the silicon carbide semiconductor layer is 4 μm or more.

4. The method according to claim 1, further comprising forming a second thermal oxide film on the surface of the silicon carbide semiconductor layer between the polishing and the ion-implanting.

5. The method according to claim 1, wherein the forming the first thermal oxide film is performed in an atmosphere containing water vapor.

6. The method according to claim 1, further comprising performing shape inspection for the surface of the silicon carbide semiconductor layer after the polishing and before the ion-implanting impurities.

7. The method according to claim 1, wherein a growth film thickness in the growing epitaxially the silicon carbide semiconductor layer is set to a film thickness obtained by adding a thickness expected to reduce in the polishing to a designed film thickness of the semiconductor device.

8. The method according to claim 4, wherein the forming the second thermal oxide film is performed in an atmosphere containing water vapor.

* * * * *